United States Patent
Jiang et al.

(10) Patent No.: US 9,763,340 B2
(45) Date of Patent: Sep. 12, 2017

(54) CURVED SURFACE DISPLAY DEVICE AND CURVED SURFACE DISPLAY METHOD

(71) Applicants: Boe Technology Group Co., Ltd., Beijing (CN); Hefei Xinsheng Optoelectronics Technology Co., Ltd., Anhui (CN)

(72) Inventors: Zhiqiang Jiang, Beijing (CN); Jianwei Yu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 14/907,081

(22) PCT Filed: Jul. 27, 2015

(86) PCT No.: PCT/CN2015/085202
§ 371 (c)(1),
(2) Date: Jan. 22, 2016

(87) PCT Pub. No.: WO2016/145760
PCT Pub. Date: Sep. 22, 2016

(65) Prior Publication Data
US 2017/0042045 A1 Feb. 9, 2017

(30) Foreign Application Priority Data

Mar. 18, 2015 (CN) .......................... 2015 1 0119818

(51) Int. Cl.
*G06F 1/16* (2006.01)
*H05K 5/00* (2006.01)
(Continued)

(52) U.S. Cl.
CPC ......... *H05K 5/0017* (2013.01); *G06F 1/1601* (2013.01); *G06F 1/1652* (2013.01);
(Continued)

(58) Field of Classification Search
CPC .... G06F 1/1652; G06F 1/1601; H05K 5/0017
(Continued)

(56) References Cited

U.S. PATENT DOCUMENTS

2014/0354519 A1* 12/2014 Lee .................. G09F 9/301
345/76
2015/0043136 A1* 2/2015 Kim .................. G02F 1/133305
361/679.01
(Continued)

FOREIGN PATENT DOCUMENTS

CN 103941456 7/2014
CN 203799589 8/2014
(Continued)

OTHER PUBLICATIONS

International Search Report and Written Opinion from PCT/CN15/85202 dated Dec. 4, 2015.
(Continued)

*Primary Examiner* — Nidhi Thaker
(74) *Attorney, Agent, or Firm* — Calfee, Halter & Griswold LLP

(57) ABSTRACT

A curved surface display device and a curved surface display method, which belong to the field of display technology. The curved display device comprises a display panel, a motor, a first arc lever and a second arc lever. A first end of the first arc lever and the second arc lever are connected with the motor through a connector, and a second end of the first arc lever and second arc lever are connected with the casing of the device. The connector is used for pulling the first end of the first arc lever and the first end of the second arc lever
(Continued)

with rotation of the motor, such that the first arc lever and the second arc lever rotate around their pivots respectively, thus realizing automatic bending of the casing, which meets the user's requirement of adjusting the curvature of the curved surface display device.

14 Claims, 4 Drawing Sheets

(51) Int. Cl.
- *H04N 5/64* (2006.01)
- *G10L 15/22* (2006.01)
- *H01R 13/629* (2006.01)
- *H05K 5/02* (2006.01)
- *G06T 7/00* (2017.01)
- *H04N 5/225* (2006.01)

(52) U.S. Cl.
CPC ........ *G10L 15/22* (2013.01); *H01R 13/62966* (2013.01); *H04N 5/64* (2013.01); *H05K 5/0217* (2013.01); *G06T 7/004* (2013.01); *G10L 2015/223* (2013.01); *H04N 5/2257* (2013.01)

(58) Field of Classification Search
USPC .................................................... 361/679.21
See application file for complete search history.

(56) References Cited

U.S. PATENT DOCUMENTS

| | | | | |
|---|---|---|---|---|
| 2015/0145837 A1* | 5/2015 | Park | ......................... | H04N 5/64 345/184 |
| 2015/0219902 A1* | 8/2015 | Kim | ................... | G02B 27/0179 345/8 |
| 2015/0271931 A1* | 9/2015 | Park | ......................... | H04N 5/64 361/807 |
| 2015/0317949 A1* | 11/2015 | Cho | ......................... | G09G 5/14 345/31 |
| 2015/0348453 A1* | 12/2015 | Jin | ......................... | G09F 9/301 345/173 |

FOREIGN PATENT DOCUMENTS

| | | |
|---|---|---|
| CN | 204069161 U | 12/2014 |
| CN | 104282231 | 1/2015 |
| CN | 104347005 | 2/2015 |
| CN | 104683719 | 6/2015 |
| JP | 2011027921 | 2/2011 |

OTHER PUBLICATIONS

First Office Action for Chinese Patent Application No. 201510119818.X dated Apr. 26, 2017.

* cited by examiner viewer

CURVED SURFACE DISPLAY DEVICE AND CURVED SURFACE DISPLAY METHOD

RELATED APPLICATIONS

The present application is the U.S. national phase entry of PCT/CN2015/085202, with an international filing date of Jul. 27, 2015, which claims the benefit of Chinese Patent Application No. 201510119818.X, filed Mar. 18, 2015, the entire disclosures of which are incorporated herein by reference.

FIELD OF THE INVENTION

The present invention relates to the field of display technology, particularly to a curved surface display device and a curved surface display method.

BACKGROUND OF THE INVENTION

The curved surface television is a television whose display screen has a certain radian after being processed. The display screen of the curved surface television bends towards the user direction to form an enclosing angle, which can provide a wider visual field and a more realistic viewing effect for the user.

The current television manufacturer, when manufacturing curved surface televisions, would change the physical properties of the flat display pane and enable the planar display panel to bend so as to manufacture a bended display panel, then assemble the bended display panel on the television module to form a curved surface television.

However, after the display panel is bended, its curvature will be fixed. Once the curved surface television is manufactured, the curvature of the curved surface television will also be fixed. The curved surface television cannot realize automatic bending and cannot meet the user's requirement of adjusting the curvature, which has strong limitations.

SUMMARY OF THE INVENTION

In order to solve the problem of the prior art, the embodiment of the present invention provides a curved surface display device and a curved surface display method. The technical solutions are as follows:

In one aspect, a curved surface display device is provided, the curved surface display device comprising: a display panel, a casing, a bracket, a motor, a first arc lever and a second arc lever;

wherein the display panel is mounted on the casing, the casing is supported by the bracket;

the first arc lever and the second arc lever are symmetrical with respect to a middle axis of the display panel in a vertical direction, and pivots of the first arc lever and the second arc lever are both located on the bracket;

a first end of the first arc lever is connected with the motor through a connector, a second end of the first arc lever is connected with the casing;

a first end of the second arc lever is connected with the motor through the connector, a second end of the second arc lever is connected with the casing;

the connector is used for pulling the first end of the first arc lever and the first end of the second arc lever with rotation of the motor, such that the first arc lever and the second arc lever rotate around their pivots respectively.

Optionally, the curved surface display device further comprises: a first push plate and a second push plate;

wherein the second end of the first arc lever is connected with the first push plate; the second end of the second arc lever is connected with the second push plate;

the first push plate and the second push plate are mounted on the casing, and located at a side of the display panel away from a viewer of the curved surface display device, the first push plate and the second push plate are symmetrical with respect to the middle axis of the display panel in the vertical direction.

Optionally, the display panel is a flexible display panel, the casing is a flexible casing, and the flexible display panel is capable of bending with bending of the flexible casing.

Optionally, the connector is a connecting line, and the connecting line passes through a pulley;

the pulley is mounted on a back cover of the casing, and is located above the motor;

a distance between the pulley and a base of the bracket, a distance between the first arc lever and the base and a distance between the second arc lever and the base are equal.

Optionally, the connecting line is a carbon fiber line.

Optionally, the motor is fixed on the base of the bracket.

Optionally, the bracket is symmetrical with respect to the middle axis of the display panel in the vertical direction, the pivot of the first arc lever and the pivot of the second arc lever are symmetrical with respect to the middle axis of the display panel in the vertical direction.

Optionally, the curved surface display device further comprises a camera electrically connected with the motor.

Optionally, the curved surface display device further comprises an infrared receiver electrically connected with the motor.

Optionally, the curved surface display device further comprises a voice receiver electrically connected with the motor.

On a second aspect, a curved surface display method is provided, the curved surface display method being applied in the curved surface display device as stated in the first aspect, the curved surface display method comprising:

motor rotating, to pull a first end of a first arc lever and a first end of a second arc lever through a connector, such that the first arc lever and the second arc lever rotate around their pivots respectively;

during rotation of the first arc lever and the second arc lever around their pivots respectively, a second end of the first arc lever and a second end of the second arc lever apply forces to a casing, so as to enable the casing to bend.

Optionally, the curved surface display device further comprises a first push plate and a second push plate; during rotation of the first arc lever and the second arc lever around their pivots respectively, the second end of the first arc lever and the second end of the second arc lever applying forces to the casing so as to enable the casing to bend comprises:

during rotation of the first arc lever and the second arc lever around their pivots respectively, the second end of the first arc lever applying a force to the first push plate, the second end of the second arc lever applying a force to the second push plate, such that the first push plate and the second push plate push the casing, so as to enable the casing to bend.

Optionally, the connector is a connecting line, the connecting line passes through a pulley; the motor rotating so as to pull the first end of the first arc lever and the first end of the second arc lever through the connector comprises:

the motor drives the pulley to rotate through the connecting line, and pulls the first end of the first arc lever and the first end of the second arc lever with rotation of the pulley.

Optionally, the curved surface display device further comprises a camera, the curved surface display method further comprises:

the camera measuring a distance between a viewer of the curved surface display device and the camera, determining a rotation direction and rotation distance of the motor based on the measured distance;

the motor rotating according to the determined rotation direction and rotation distance.

Optionally, the curved surface display device further comprises an infrared receiver, and the curved surface display method further comprises:

the infrared receiver receiving an infrared signal transmitted by a remote controller, determining a rotation direction and a rotation distance of the motor based on the infrared signal;

the motor rotating according to the determined rotation direction and rotation distance.

Optionally, the curved surface display device further comprises a voice receiver, the curved surface display method further comprises:

the voice receiver receiving voice information, determining a rotation direction and a rotation distance of the motor based on adjustment voice information contained in the voice information;

the motor rotating according to the determined rotation direction and rotation distance.

The benefits provided by the technical solutions described herein include:

In the curved surface display device and the curved surface display method provided by the embodiments of the present invention, the motor is connected with the first end of the arc lever. The second end of the arc lever is connected with the casing. The motor rotates to pull the first end of the arc lever such that the arc lever rotates around the pivot. The lever principle is used such that the second end of the arc lever applies a force to the casing to enable the casing to bend, which realizes automatic bending of the casing, meets the user's requirement of adjusting the curvature of the curved surface display device, and has high flexibility.

BRIEF DESCRIPTION OF THE DRAWINGS

In order to explain the technical solutions in the embodiments of the present invention more clearly, the drawings to be used in the description of the embodiments will be introduced briefly. The drawings described below are only some embodiments of the present invention. An ordinary skilled person in the art, having the benefit of the present disclosure, may obtain additional embodiments without undue experimentation, which are within the scope and protection of the embodiments illustrated in the present figures.

DETAILED DESCRIPTION OF THE INVENTION

Figure 1:
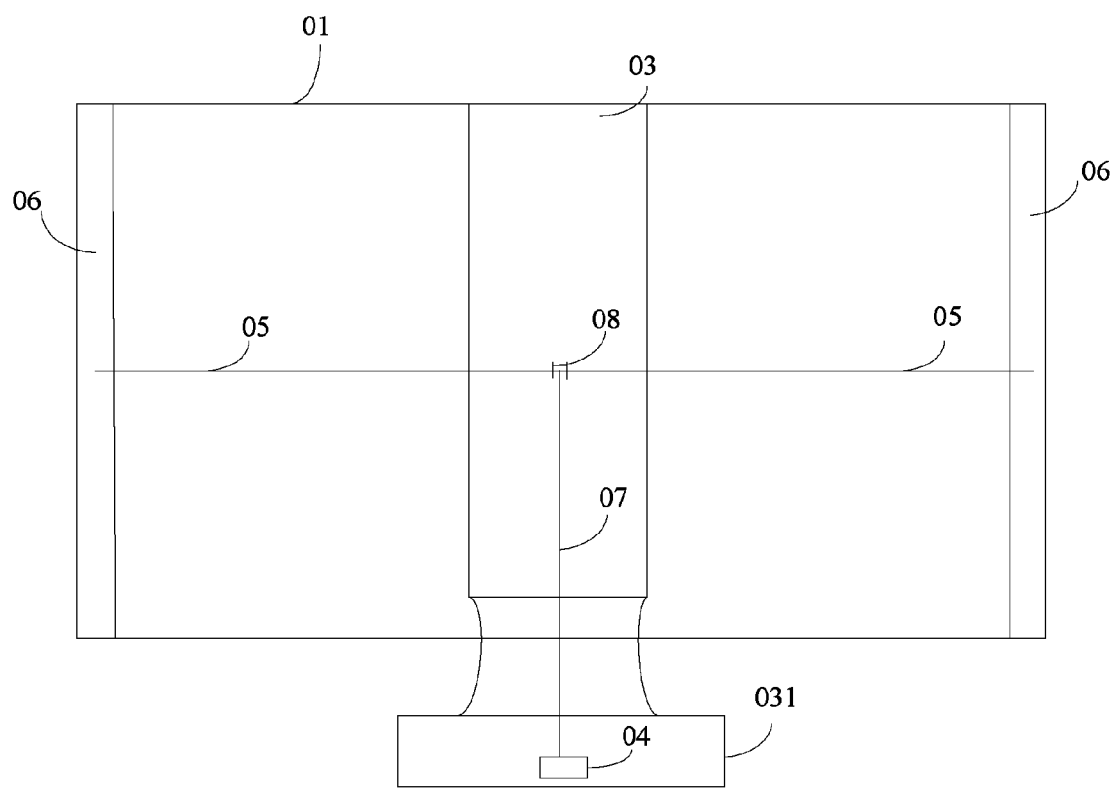
FIG. 1 is a back view of a curved surface display device provided by an embodiment of the present invention.

Next, the technical solutions in embodiments of the present invention will be described clearly and completely with reference to the drawings in the embodiments of the present invention. Apparently, the embodiments described are part of rather than all of the embodiments of the present invention. Based on the embodiments in the present invention, all other embodiments obtained by the ordinary skilled person in the art without undue experimentation belong to the protection scope of the present invention.

An embodiment of the present invention provides a curved surface display device, the curved surface display device can be a curved surface television, a curved surface display and the like. The curved surface display device comprises: a display panel, a casing, a bracket, a motor, a first arc lever and a second arc lever.

The display panel is mounted on the casing. Specifically, the casing can comprise a frame and a back cover, with the display panel mounted on the back cover, the periphery of the display panel enclosed by the frame, and the display panel fixed so as to ensure that the display panel faces the view of the curved surface display device.

Optionally, the display panel is a flexible display panel, the casing is a flexible casing, the flexible display panel can bend with bending of the flexible casing. For example, when the back cover of the casing bends, the display panel can bend with the bending of the back cover.

Further, the display panel can be an organic light-emitting diode (OLED) display panel. The OLED display panel has a small thickness and a better flexible bending capability.

In addition, the display panel can be a symmetrical structure, the display panel comprises a middle axis in a vertical direction and a middle axis in a horizontal direction. The curved surface display device can also be a symmetrical structure, the curved surface display device comprises a middle axis in a vertical direction and a middle axis in a horizontal direction, the middle axis of the curved surface display device in the vertical direction and the middle axis of the display panel in the vertical direction are located in a same vertical plane, and the vertical plane is perpendicular to the plane where the display panel locates.

In the embodiment of the present invention, the casing is supported by the bracket. Optionally, the bracket is symmetrical with respect to the middle axis of the display panel in the vertical direction, i.e., the middle axis of the bracket is also located in the vertical plane where the middle axis of the curved surface display device in the vertical direction and the middle axis of the display panel in the vertical direction locate, such that the bracket can support the curved surface display device stably and ensure balance of the curved surface display device.

Optionally, the bracket comprises a base and a support portion, the support portion is located above the base and is connected with the base, the support portion is connected with the casing. Further optionally, the casing comprises an upper part and a lower part, the support portion is used for supporting the upper part of the casing. In addition, the base can also be connected with the casing. For example, the base is connected with the low part of the casing so as to support the whole casing and ensure stabilization of the whole curved surface display device. The bottom surface of the base can be a plane, thereby being capable of placing the curved surface display device on a table top stably.

Further, the motor can be fixed on the base of the bracket, thereby ensuring that the mounting position of the motor will not be changed when the motor rotates, so as to realize effective fixation of the motor.

In an embodiment of the present invention, the first end of the arc lever is connected with the motor, the second end is connected with the casing, the motor rotates to pull the first end of the arc lever such that the arc lever rotates around the pivot. The level principle is used such that the second end of the arc lever applies a force to the casing to enable the casing to bend, here the curvature of the casing will be changed so as to realize automatic bending of the casing.

Wherein, the curvature of a circular arc refers to a reciprocal of the radius of a circle formed when this circular arc is a part of the circle, the larger the curvature is, the greater the bending degree of the circular arc will be, the smaller the curvature is, the smaller the bending degree of the circular arc will be.

Optionally, the curved surface display device further comprises a first push plate and a second push plate, the first push plate and the second push plate are mounted on the casing, the second end of the first arc lever is connected with the first push plate; the second end of the second arc lever is connected with the second push plate; the first push plate and the second push plate are located at a side of the display panel away from a viewer of the curved surface display device, the first push plate and the second push plate are symmetrical with respect to the middle axis of the display panel in the vertical direction.

Specifically, the first end of the first arc lever is connected with the motor through a connector, the second end of the first arc lever is connected with the first push plate, and the first end of the second arc lever is connected with the motor through the connector, the second end of the second arc lever is connected with the second push plate. The connector is used for pulling the first end of the first arc lever and the first end of the second arc lever with rotation of the motor, such that the first arc lever and the second arc lever rotate around their pivots respectively. During the rotation, the second end of the first arc lever applies a force to the first push plate, the second end of the second arc lever applies a force to the second push plate, such that the first push plate and the second push plate push the casing so as to enable the casing to bend and the curvature of the casing to be changed.

The motor in an embodiment of the present invention can rotate towards two directions, such as the clockwise direction and the counterclockwise direction. The two directions are called a first direction and a second direction respectively, when the motor rotates towards the first direction, the pulling force to the first end of the arc lever is increased such that the second end of the arc lever increases the acting force to the push plate, thereby resulting in increase of the bending degree of the casing and increase of the curvature of the curved surface display device. However, when the motor rotates towards the second direction, the pulling force to the first end of the arc lever is reduced such that the second end of the arc lever reduces the acting force to the push plate, thereby resulting in reduction of the bending degree of the casing and reduction of the curvature of the curved surface display device.

Wherein, the first direction refers to a direction of increasing the curvature of the curved surface display device, the second direction refers to a direction of reducing the curvature of the curved surface display device. The first direction can be the clockwise direction, the second direction is the counterclockwise direction, or, the first direction can be the counterclockwise direction, the second direction is the clockwise direction, which will not be defined in the embodiment of the present invention.

In addition, the connector between the first end of the arc lever and the motor can be a connecting device such as a shaft coupler, which will not be defined in the embodiment of the present invention. Optionally, the connector is a connecting line, when the motor rotates the first end of the arc lever can be pulled through the connecting line. The connecting line can be a carbon fiber line, the carbon fiber line has great intensity, is corrosion preventive, high-temperature resistant, and has excellent mechanical and electrical properties, which is applicable in the curved surface display device. Further, the curved surface display device can further comprise a pulley, the pulley is mounted on the back cover of the casing, after passing through the pulley, the connecting line of the motor is connected with the first end of the arc lever. The pulley can be mounted above the motor, which is convenient for pulling the first end of the arc lever through the pulley when the motor rotates.

An embodiment of the present invention adopts the connecting line to connect the first end of the arc lever and the motor, and the pulley that the connecting line passes through is located above the motor. Compared with the connecting devices such as the shaft coupler, the connecting line occupies a very small space, and the pulley is located above the motor which occupies a small thickness space, so that the thinness of the curved surface display device is realized.

Optionally, a distance between the pulley and the base, a distance between the first arc lever and the base and a distance between the second arc lever and the base are equal, thus the height where the center of gravity of the pulley locates, the height where the center of gravity of the first arc lever locates and the height where the center of gravity of the second arc lever locates are equal. If the connecting line is divided into a first connecting line and a second connecting line according to the position where the pulley locates, the first connecting line is connected with the first end of the arc lever, the second connecting line is connected with the motor, then the first connecting line is parallel to the horizontal plane, the second connecting line is parallel to the vertical plane, the angle between the first connecting line and the second connecting line is a right angle, which is convenient for the connecting line to pass through the pulley to pull the first end of the arc lever when the motor rotates.

In an embodiment of the present invention, the first arc lever and the second arc lever are symmetrical with respect to a middle axis of the display panel in a vertical direction. Specifically, the arc lever is regarded as a combination of multiple lever segments, the length of each lever segment is very small, thus each lever segment on the first arc lever and a corresponding lever segment on the second arc lever are symmetrical with respect to the middle axis of the display panel in the vertical direction, such that the curvature of each lever segment on the first arc lever and the second arc lever is equal. When the motor rotates, the moving tracks of the first arc lever and the second arc lever are symmetrical with respect to the middle axis of the display panel in the vertical direction.

In addition, the pivots of the first arc lever and the second arc lever are both located on the bracket, which realizes effective fixation of the pivots and ensures that the first end of the arc lever can rotate around the pivot and drive the second end of the arc lever to move. Optionally, the pivot of the first arc lever and the pivot of the second arc lever are symmetrical with respect to the middle axis of the display panel in the vertical direction, i.e., the pivot of the first arc lever and the pivot of the second arc lever are symmetrical.

The first arc lever and the second arc lever are symmetrical, the pivots of the first arc lever and the second arc lever are also symmetrical, which ensures that when the motor rotates, the moving distances of the first end of the first arc lever and the first end of the second arc lever are same, the moving distances of the second end of the first arc lever and the second end of the second arc lever are also same, so as to ensure that the force applied by the second end of the first arc lever to the first push plate and the force applied by the second end of the second arc lever to the second push plate are same.

With respect to the push plate of the curved surface display device, the first push plate and the second push plate are mounted on the casing, and are located at a side of the display panel away from a viewer of the curved surface display device. When a force is applied to the first push plate, the first push plate can push the casing towards the direction of the viewer of the curved surface display device such that the casing bends towards the direction of the viewer. Similarly, when a force is applied to the second push plate, the second push plate can push the casing towards the direction of the viewer of the curved surface display device such that the casing bends towards the direction of the viewer.

Further, the first push plate and the second push plate are symmetrical with respect to the middle axis of the display panel in the vertical direction, i.e., the first push plate and the second push plate are in bilateral symmetry. From the line-of-sight direction of the viewer, take the example that the first push plate is located at the left of the casing and the second push plate is located at the right of the casing, if the casing is divided by the middle axis, the casing can be divided into a left casing and a right casing, then the first push plate is used for pushing the left casing and the second push plate is used for pushing the right casing. When a same force is applied to the first push plate and the second push plate respectively, the first push plate pushes the left casing towards the direction of the viewer such that the left casing bends towards the direction of the viewer, the second push plate pushes the right casing towards the direction of the viewer such that the right casing also bends towards the direction of the viewer, moreover, the bending degree of the right casing is consistent with the bending degree of the left casing, thereby enabling the curvatures of the left and the right of the casing to be equal.

For example, the first push plate and the second push plate are mounted on the back cover of the curved surface display device. When a force is applied to the push plate, the push plate pushes the back cover to bend, the back cover will drive the casing of other positions to bend and will also drive the display panel mounted on the back cover to bend.

The curved surface display device may further comprise a camera electrically connected with the motor, which can transmit a control signal to the motor. The camera is used for measuring a distance between the viewer of the curved surface display device and the camera, the distance can represent a distance between the viewer and the curved surface display device. The camera can determine a rotation direction and a rotation distance of the motor based on the measured distance, and transmit a control signal to the motor, the motor rotates according to the determined rotation direction and the rotation distance.

The camera can be mounted on the frame of the casing of the curved surface display device, thus the distance between the viewer and the camera measured by the camera is namely the distance between the viewer and the display panel. Certainly, the camera can also be mounted on the bracket of the curved surface display device or other positions, as long as the camera faces the viewer of the curved surface display device, the embodiment of the present invention makes no definition on the mounting position of the camera.

When the viewer is closer to the curved surface display device, the motor is controlled to rotate towards the first direction, so as to increase the curvature of the curved surface display device and ensure the bending degree of the curved surface display device to be increased, thereby facilitating the viewer to view at a short distance. When the viewer is farther from the curved surface display device, the motor is controlled to rotate towards the second direction, so as to reduce the curvature of the curved surface display device and ensure the bending degree of the curved surface display device to be reduced, thereby facilitating the viewer to view at a long distance.

The embodiment of the present invention, by arranging a camera in the curved surface display device, can adjust the curvature of the curved surface display device automatically based on the position where the viewer locates currently, which realizes automatic bending of the curved surface display device and has high flexibility.

In addition, the curved surface display device can further comprise an infrared receiver, the infrared receiver is electrically connected with the motor, and can transmit a control signal to the motor. The infrared receiver is used for receiving an infrared signal transmitted by a remote controller, determining a rotation direction and a rotation distance of the motor based on the infrared signal, and transmitting the control signal to the motor, the motor rotates according to the determined rotation direction and rotation distance.

The remote controller can comprise curvature adjustment buttons "+" and "−", when the viewer clicks the button "+", the remote controller transmits an infrared signal of increasing the curvature, when the infrared receiver receives the infrared signal of increasing the curvature, it controls the motor to rotate for a preset distance toward the first direction. When the viewer wants to increase the curvature of the curved surface display device further, he can keep on clicking the button "+".

When the viewer clicks the button "−", the remote controller transmits an infrared signal of reducing the curvature, when the infrared receiver receives the infrared signal of reducing the curvature, it controls the motor to rotate for a preset distance towards the second direction. When the viewer wants to reduce the curvature of the curved surface display device further, he can keep on clicking the button "−".

The embodiment of the present invention, by arranging an infrared receiver in the curved surface display device, enables the viewer to adjust the curvature of the curved surface display device only by using the remote controller, which realizes automatic bending of the curved surface display device and has high flexibility.

The curved surface display device may further comprise a voice receiver, the voice receiver is electrically connected with the motor, and can transmit a control signal to the motor. The voice receiver is used for capturing voice information from the viewer of the curved surface display device, the voice information containing adjustment voice information for indicating adjustment of the curvature of the curved surface display device. The voice receiver can determine a rotation direction and a rotation distance of the motor based on the adjustment voice information, the motor rotates according to the determined rotation direction and rotation distance.

For example, when the viewer wants to increase the curvature of the curved surface display device, the voice information including words such as "near" is transmitted, then the voice information received by the voice receiver includes "near", it can be considered that the distance between the viewer and the curved surface display device is shortened, thus the motor is controlled to rotate towards the first direction so as to increase the curvature of the curved surface display device and ensure the bending degree of the curved surface display device to be increased, thereby facilitating the viewer to view at a short distance. For another example, when the viewer wants to reduce the curvature of the curved surface display device, the voice information including words such as "far" is transmitted, then the voice information received by the voice receiver includes "far", it can be considered that the distance between the viewer and the curved surface display device is lengthened, thus the motor is controlled to rotate towards the second direction so as to reduce the curvature of the curved surface display device and ensure the bending degree of the curved surface display device to be reduced, thereby facilitating the viewer to view at a long distance.

The embodiment of the present invention, by arranging a voice receiver in the curved surface display device, can receive the adjustment voice information from the viewer, and adjust the curvature of the curved surface display device based on the adjustment voice information, which realizes automatic bending of the curved surface display device and has high flexibility.

The curved surface display device provided by an embodiment of the present invention comprises a display panel, a motor, a first arc lever and a second arc lever. The motor is connected with the first end of the arc lever. The second end of the arc lever is connected with the casing. The motor rotates to pull the first end of the arc lever such that the arc lever rotates around the pivot. The lever principle is used such that the second end of the arc lever applies a force to the casing to enable the casing to bend, which realizes automatic bending of the casing, meets the user's requirement of adjusting the curvature of the curved surface display device, and has high flexibility.

By using the curved surface display device provided by the embodiment of the present invention, the technical problem that automatic bending cannot be realized is solved, the technical effect of automatic bending can be achieved, the user's requirement of adjusting the curvature is met. By adjusting the curvature of the curved surface display device, the curved surface display device can provide optimal viewing effect from one edge to the other edge, the whole display panel forms an enclosing angle towards the direction of the viewer, which can provide a wider visual field and a more realistic viewing effect for the user.

Further, since the eyeballs of the human being are in an arc shape, if the display panel is a plane, what the display panel provides is a planar display screen, whereas the central axis of the planar display screen is not parallel to the central axis of the eyeball of the viewer, the viewer will be in an off-axis viewing state when viewing, which may easily result in picture distortion. However, the curved surface display device provided by the embodiment of the present invention can adjust the curvature of the curved surface display device automatically based on the position of the viewer, such that the curvature of the curved surface display device matches the radian of the viewer's eyeball, off-axis viewing distortion can be reduced when the viewer is viewing at a short distance, moreover, a perfect visual angle for viewing can be obtained no matter at what position the viewer locates.

Next, the contents of the embodiments of the present invention will be explained in combination with FIG. 1 to FIG. 4.

Figure 2:
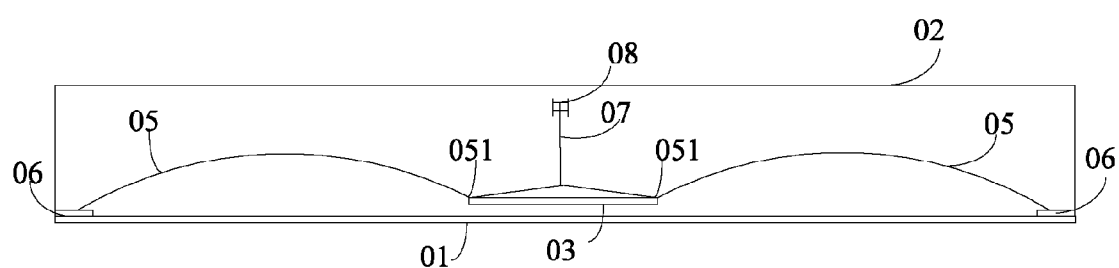
FIG. 2 is a vertical view of a curved surface display device provided by an embodiment of the present invention.
Figure 3:
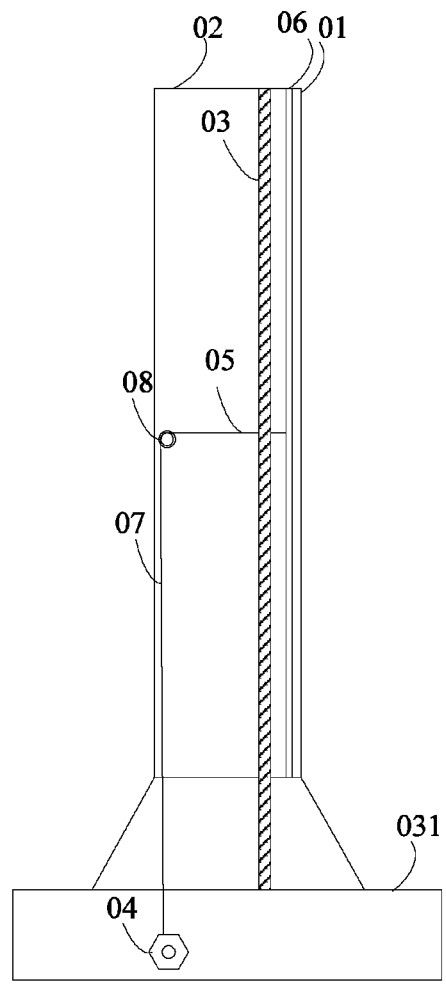
FIG. 3 is a side view of a curved surface display device provided by an embodiment of the present invention.

FIG. 1 is a back view of a curved surface display device provided by an embodiment of the present invention, FIG. 2 is a vertical view of a curved surface display device provided by an embodiment of the present invention, FIG. 3 is a side view of a curved surface display device provided by an embodiment of the present invention. Referring to FIG. 1 to FIG. 3, the curved surface display device comprises: a display panel 01, a casing 02, a bracket 03, a motor 04, two arc levers 05, two push plates 06. The display panel 01 is mounted on the casing 02, the casing 02 is supported by the bracket 03. The bracket 03 comprises a base 031, the motor 04 is fixed on the base 031. Each arc lever 05 comprises a first end, a second end and a pivot 051, the first end of the arc lever is connected with the motor 04 through a connecting line 07, the second end of the arc lever is connected with the push plate 06. The curved surface display device further comprises a pulley 08, the connecting line 07 passes through the pulley 08, the pulley 08 is mounted on the back cover of the casing 02.

It can be seen from FIG. 1 and FIG. 3 that the distance between the pulley 08 and the base 031 and the distance between the two arc lever 05 and the base 031 are equal, i.e., the heights of the pulley 08 and the arc lever 05 are equal.

It can be seen from FIG. 3 that the pulley 08 is located above the motor 04. If the connecting line 07 is divided into a first connecting line and a second connecting line according to the position where the pulley locates, the angle between the first connecting line and the second connecting line is a right angle, which is convenient for the connecting line 07 to pass through the pulley 08 to pull the first end of the arc lever 05 when the motor 04 rotates.

It can be seen from FIG. 1 and FIG. 2 that the two arc levers 05 are symmetrical with respect to the middle axis of the display panel 01 in the vertical direction. The pivot 051 of the arc lever 05 is located on the bracket 03, the bracket 03 is symmetrical with respect to the middle axis of the display panel 01 in the vertical direction, the pivots 051 of the two arc levers 05 are symmetrical with respect to the middle axis of the display panel 01 in the vertical direction.

It can be seen from FIG. 1 that the push plates 06 are mounted on the casing 02, and are located at a side of the display panel away from the viewer of the curved surface display device, i.e., being located at the backside of the display panel 01. The two push plates 06 are symmetrical with respect to the middle axis of the display panel 01 in the vertical direction.

Figure 4:
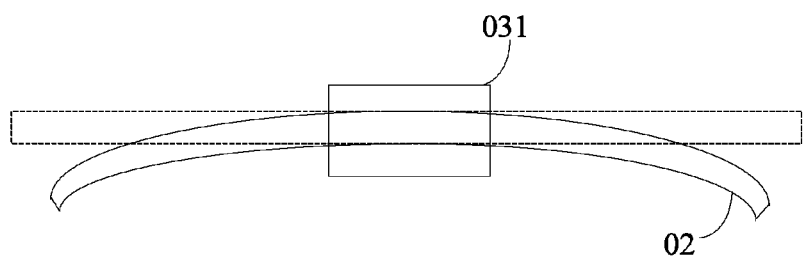
FIG. 4 is a schematic view of bending effect of a curved surface display device provided by an embodiment of the present invention.

FIG. 4 is a schematic view of bending effect of a curved surface display device provided by an embodiment of the present invention. Referring to FIG. 4, from a top-down direction, the casing 02 is located at a first position (as shown by the broken line) originally, then the curved surface display device bends, the casing 02 bends to a second position (as shown by the real line), the curvature of the casing 02 is changed.

Figure 5:
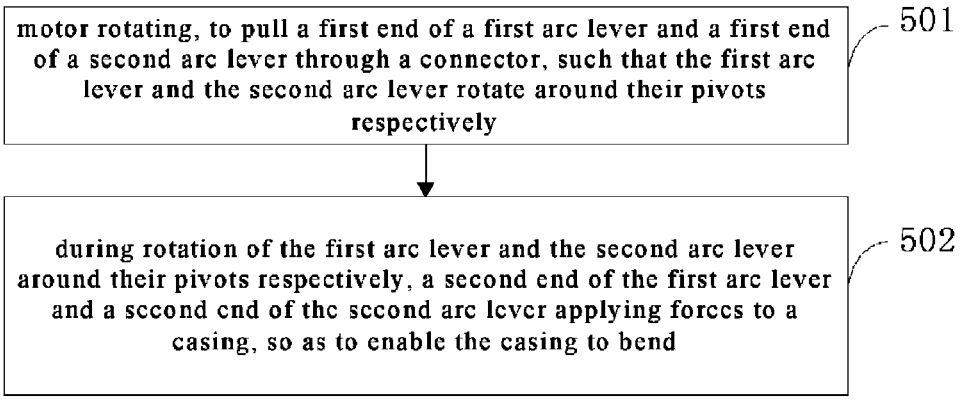
FIG. 5 is a flow chart of a curved surface display method provided by an embodiment of the present invention.

FIG. 5 is a flow chart of a curved surface display method provided by an embodiment of the present invention. The execution subject of this embodiment is the curved surface display device as shown in the above embodiments, referring to FIG. 5, the method comprises:

501, motor rotating, to pull a first end of a first arc lever and a first end of a second arc lever through a connector, such that the first arc lever and the second arc lever rotate around their pivots respectively.

502, during rotation of the first arc lever and the second arc lever around their pivots respectively, a second end of the first arc lever and a second end of the second arc lever applying forces to a casing, so as to enable the casing to bend.

Optionally, the curved surface display device can further comprise a first push plate and a second push plate, the first push plate and the second push plate are mounted on the casing, the second end of the first arc lever is connected with the first push plate, the second end of the second arc lever is connected with the second push plate. The first push plate and the second push plate are located at a side of the display panel away from a viewer of the curved surface display device.

During rotation of the first arc lever and the second arc lever around their pivots respectively, the second end of the first arc lever applies a force to the first push plate, the second end of the second arc lever applies a force to the second push plate, such that the first push plate and the second push plate push the casing so as to enable the casing to bend.

The motor can rotate in two directions, such as the clockwise direction and the counterclockwise direction. Optionally, the two directions are called a first direction and a second direction respectively, the first direction refers to a direction of increasing the curvature of the curved surface display device, the second direction refers to a direction of reducing the curvature of the curved surface display device.

When the motor rotates towards the first direction, the first end of the first arc lever and the first end of the second arc lever are pulled through the connector, such that the first arc lever and the second arc lever rotate around their pivots respectively. During rotation of the first arc lever and the second arc lever around their pivots respectively, since the connector increases the pulling force to the first end of the first arc lever and the pulling force to the first end of the second arc lever, the second end of the first arc lever increases the acting force to the first push plate, and the second end of the second arc lever increases the acting force to the second push plate, the first push plate and the second push plate increase the pushing force to the casing, thereby resulting in increase of the bending degree of the casing, the curvature of the curved surface display device is increased.

However, when the motor rotates towards the second direction, the first end of the first arc lever and the first end of the second arc lever are pulled through the connector, such that the first arc lever and the second arc lever rotate around their pivots respectively. During rotation of the first arc lever and the second arc lever around their pivots respectively, since the connector reduces the pulling force to the first end of the first arc lever and the pulling force to the first end of the second arc lever, the second end of the first arc lever reduces the acting force to the first push plate, and the second end of the second arc lever reduces the acting force to the second push plate, the first push plate and the second push plate reduce the pushing force to the casing, thereby resulting in reduction of the bending degree of the casing, the curvature of the curved surface display device is reduced.

Wherein the first direction can be the clockwise direction, the second direction is the counterclockwise direction, or, the first direction is the counterclockwise direction, the second direction is the clockwise direction, which will not be defined in the embodiment of the present invention.

It needs to be explained that the embodiment of the present invention only takes motor rotation for explanation, actually, the motor can rotate based on a control signal, the control signal can be transmitted by a camera electrically connected with the motor, and can also be transmitted by an infrared receiver electrically connected with the motor, and can also be transmitted by a voice receiver electrically connected with the motor, etc., which will not be defined in the embodiment of the present invention.

In the curved surface display method provided by the embodiment of the present invention, the motor rotates to pull the first end of the arc lever, such that the arc lever rotates around the pivot, the lever principle is used such that the second end of the arc lever applies a force to the casing so as to enable the casing to bend, which realizes automatic bending of the casing, meets the user's requirement of adjusting the curvature of the curved surface display device, and has high flexibility.

Optionally, the connector is a connecting line, the connecting line passes through a pulley; the curved surface display device specifically comprises:

the motor driving the pulley to rotate through the connecting line, and pulling the first end of the first arc lever and the first end of the second arc lever with rotation of the pulley.

Optionally, the curved surface display device further comprises a camera, the curved surface display device specifically comprises:

the camera measuring a distance between a viewer of the curved surface display device and the camera, determining a rotation direction and rotation distance of the motor based on the measured distance;

the motor rotating according to the determined rotation direction and rotation distance.

Optionally, the curved surface display device further comprises an infrared receiver, the curved surface display method specifically comprises:

the infrared receiver receiving an infrared signal transmitted by a remote controller, determining a rotation direction and a rotation distance of the motor based on the infrared signal;

the motor rotating according to the determined rotation direction and rotation distance.

All of the above optional technical solutions can be combined arbitrarily so as to form optional embodiments of the present invention, which will not be repeated here.

Figure 6:
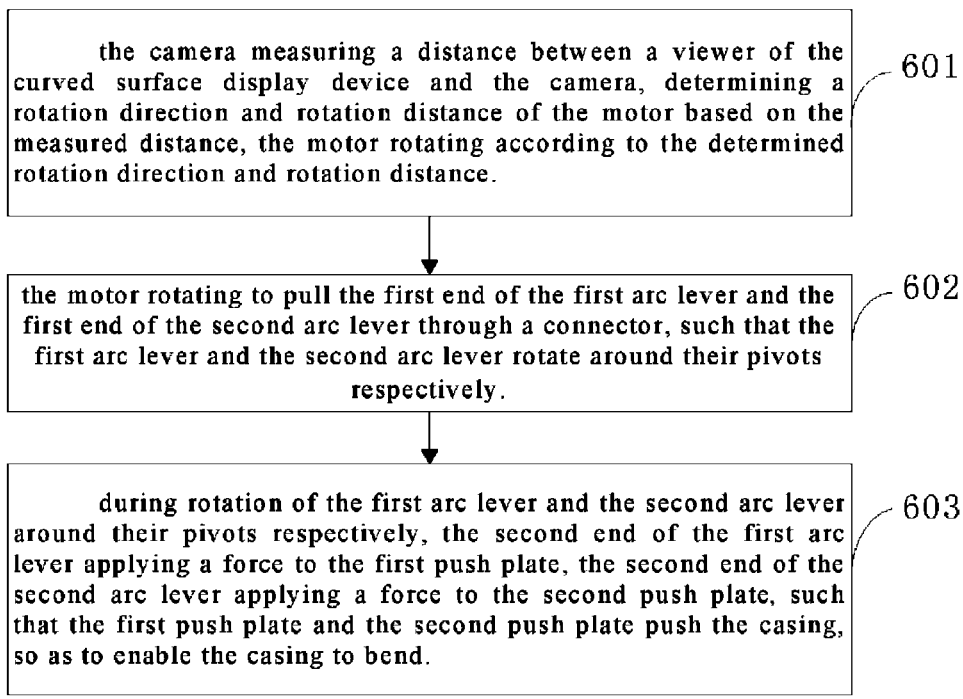
FIG. 6 is a flow chart of another curved surface display method provided by an embodiment of the present invention.

FIG. 6 is a flow chart of another curved surface display method provided by an embodiment of the present invention. The execution subject of this embodiment is the curved surface display device as shown in the above embodiments, the curved surface display device further comprises a camera, referring to FIG. 6, the method comprises:

601: the camera measuring a distance between a viewer of the curved surface display device and the camera, determining a rotation direction and rotation distance of the motor based on the measured distance, the motor rotating according to the determined rotation direction and rotation distance.

The camera is used for measuring the distance between the viewer of the curved surface display device and the camera. Optionally, the camera can trace the eyes of the viewer, and measure the distance between the viewer and the camera based on the position of the eyes of the viewer. The distance can represent a distance between the viewer and the curved surface display device. The camera can determine a rotation direction and a rotation distance based on the measured distance, the motor rotates according to the determined rotation direction and rotation distance.

When the viewer is closer to the curved surface display device, the motor is controlled to rotate towards the direction of increasing the curvature, so as to increase the curvature of the curved surface display device and ensure the bending degree of the curved surface display device to be increased, thereby facilitating the viewer to view at a short distance. When the viewer is farther from the curved surface display device, the motor is controlled to rotate towards the direction of reducing the curvature, so as to reduce the curvature of the curved surface display device and ensure the bending degree of the curved surface display device to be reduced, thereby facilitating the viewer to view at a long distance.

602, the motor rotating to pull the first end of the first arc lever and the first end of the second arc lever through a connector, such that the first arc lever and the second arc lever rotate around their pivots respectively.

Optionally, the connecting is a connecting line, the connecting lines passes through a pulley, the motor drives the pulley to rotate through the connecting line and pulls the first end of the first arc lever and the first end of the second arc lever with rotation of the pulley.

603, during rotation of the first arc lever and the second arc lever around their pivots respectively, the second end of the first arc lever applying a force to the first push plate, the second end of the second arc lever applying a force to the second push plate, such that the first push plate and the second push plate push the casing, so as to enable the casing to bend.

In the curved surface display method provided by the embodiment of the present invention, the motor rotates to pull the first end of the arc lever, such that the arc lever rotates around the pivot. The lever principle is used such that the second end of the arc lever applies a force to the casing so as to enable the casing to bend, which realizes automatic bending of the casing. Moreover, a camera measures the distance between the viewer of the curved surface display device and the camera and determines a rotation direction and rotation distance of the motor, the curvature of the curved surface display device can be adjusted automatically based on the position where the viewer locates currently, which realizes automatic bending of the curved surface display device, meets the user's requirement of adjusting the curvature of the curved surface display device, and has high flexibility.

Figure 7:
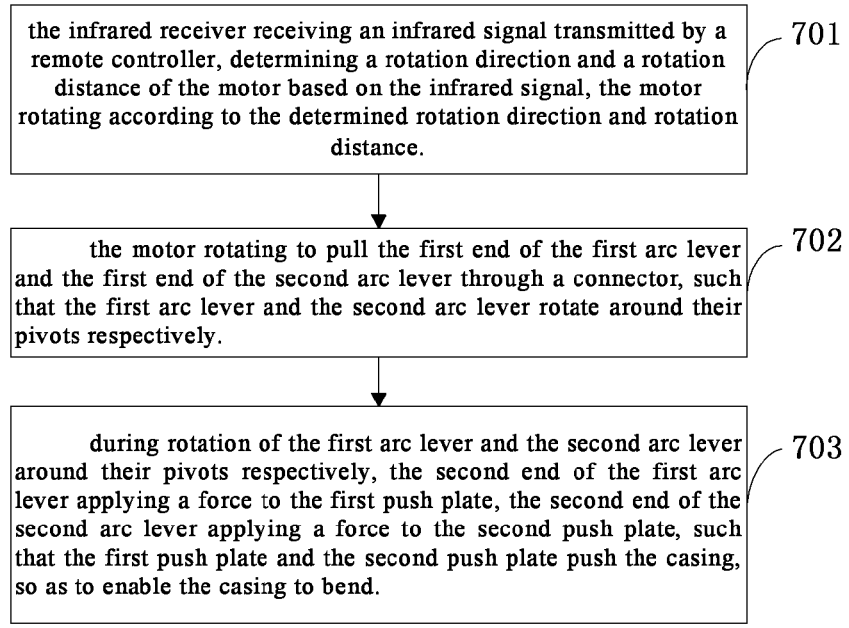
FIG. 7 is a flow chart of a further curved surface display method provided by an embodiment of the present invention.

FIG. 7 is a flow chart of a further curved surface display method provided by an embodiment of the present invention. The execution subject of this embodiment is the curved surface display device as shown in the above embodiments, the curved surface display device further comprises an infrared receiver, referring to FIG. 7, the method comprises:

701, the infrared receiver receiving an infrared signal transmitted by a remote controller, determining a rotation direction and a rotation distance of the motor based on the infrared signal, the motor rotating according to the determined rotation direction and rotation distance.

The infrared receiver is used for receiving an infrared signal transmitted by a remote controller, determining a rotation direction and a rotation distance of the motor based on the infrared signal, the motor rotates according to the determined rotation direction and rotation distance.

Optionally, the remote controller can comprise curvature adjustment buttons "+" and "−". When the viewer clicks the button "+", the remote controller transmits an infrared signal of increasing the curvature, when the infrared receiver receives the infrared signal of increasing the curvature, it controls the motor to rotate for a preset distance toward the first direction. When the viewer wants to increase the curvature of the curved surface display device further, he can keep on clicking the button "+". When the viewer clicks the button "−", the remote controller transmits an infrared signal of reducing the curvature, when the infrared receiver receives the infrared signal of reducing the curvature, it controls the motor to rotate for a preset distance towards the second direction. When the viewer wants to reduce the curvature of the curved surface display device further, he can keep on clicking the button "−".

702, the motor rotating to pull the first end of the first arc lever and the first end of the second arc lever through a connector, such that the first arc lever and the second arc lever rotate around their pivots respectively.

703, during rotation of the first arc lever and the second arc lever around their pivots respectively, the second end of the first arc lever applying a force to the first push plate, the second end of the second arc lever applying a force to the second push plate, such that the first push plate and the second push plate push the casing, so as to enable the casing to bend.

In the curved surface display method provided by the embodiment of the present invention, the motor rotates to pull the first end of the arc lever, such that the arc lever rotates around the pivot. The lever principle is used such that the second end of the arc lever applies a force to the casing so as to enable the casing to bend, which realizes automatic bending of the casing. Moreover, an infrared receiver receives an infrared signal transmitted from the remote controller and determines a rotation direction and rotation distance of the motor, such that the viewer can adjust the curvature of the curved surface display device only by using the remote controller, which realizes automatic bending of the curved surface display device, meets the user's requirement of adjusting the curvature of the curved surface display device, and has high flexibility.

Figure 8:
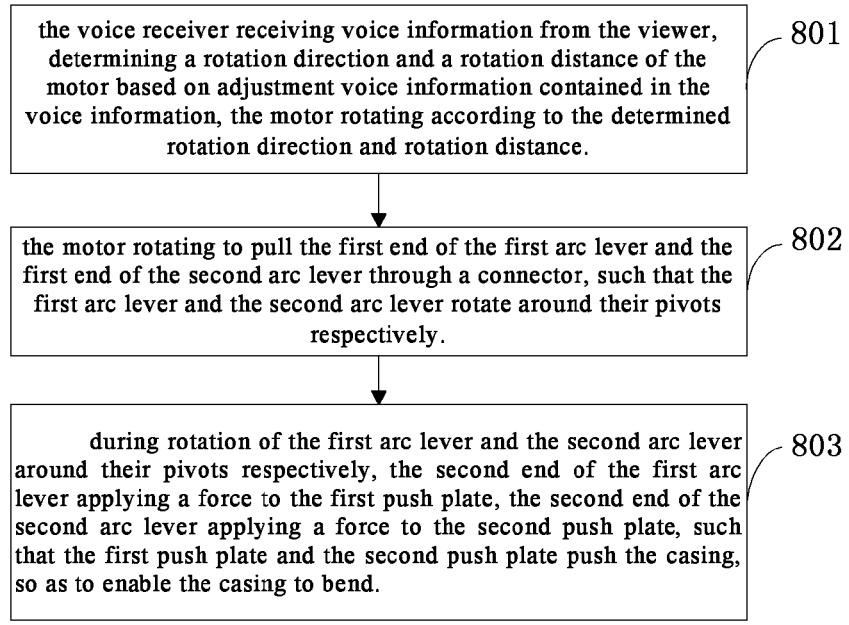
FIG. 8 is a flow chart of yet another curved surface display method provided by an embodiment of the present invention.

FIG. 8 is a flow chart of yet another curved surface display method provided by an embodiment of the present invention, referring to FIG. 8, the execution subject of this embodiment is the curved surface display device as shown in the above embodiments, the curved surface display device further comprises a voice receiver, referring to FIG. 8, the method comprises:

801, the voice receiver receiving voice information from the viewer, determining a rotation direction and a rotation distance of the motor based on adjustment voice information contained in the voice information, the motor rotating according to the determined rotation direction and rotation distance.

The voice receiver is used for capturing voice information from the viewer of the curved surface display device, the voice information containing adjustment voice information for indicating adjustment of the curvature of the curved surface display device. The voice receiver can determine a rotation direction and a rotation distance of the motor based on the adjustment voice information, the motor rotates according to the determined rotation direction and rotation distance.

For example, when the viewer wants to increase the curvature of the curved surface display device, the voice information including words such as "near" is transmitted, then the voice information received by the voice receiver includes "near", it can be considered that the distance between the viewer and the curved surface display device is shortened, thus the motor is controlled to rotate towards the first direction so as to increase the curvature of the curved surface display device and ensure the bending degree of the curved surface display device to be increased, thereby facilitating the viewer to view at a short distance. For another example, when the viewer wants to reduce the curvature of the curved surface display device, the voice information including words such as "far" is transmitted, then the voice information received by the voice receiver includes "far", it can be considered that the distance between the viewer and the curved surface display device is lengthened, thus the motor is controlled to rotate towards the second direction so as to reduce the curvature of the curved surface display device and ensure the bending degree of the curved surface display device to be reduced, thereby facilitating the viewer to view at a long distance.

The embodiment of the present invention, by arranging a voice receiver in the curved surface display device, can receive the adjustment voice information from the viewer, and adjust the curvature of the curved surface display device based on the adjustment voice information, which realizes automatic bending of the curved surface display device and has high flexibility.

802, the motor rotating to pull the first end of the first arc lever and the first end of the second arc lever through a connector, such that the first arc lever and the second arc lever rotate around their pivots respectively.

803, during rotation of the first arc lever and the second arc lever around their pivots respectively, the second end of the first arc lever applying a force to the first push plate, the second end of the second arc lever applying a force to the second push plate, such that the first push plate and the second push plate push the casing, so as to enable the casing to bend.

In the curved surface display method provided by the embodiment of the present invention, the motor rotates to pull the first end of the arc lever, such that the arc lever rotates around the pivot. The lever principle is used such that the second end of the arc lever applies a force to the casing so as to enable the casing to bend, which realizes automatic bending of the casing. Moreover, a voice receiver receives voice information from the viewer and determines a rotation direction and rotation distance of the motor, such that the viewer can adjust the curvature of the curved surface display device only by making a voice, which realizes automatic bending of the curved surface display device, meets the user's requirement of adjusting the curvature of the curved surface display device, and has high flexibility.

A person having ordinary skill in the art can appreciate that all or part of the steps for implementing the above embodiments can be either performed by hardware or performed by a program instructing related hardware. A program may be stored in a computer readable storage medium, such as ROM, a magnetic disk, an optical disk, etc.

What is stated above are only part of embodiments of the present invention, and the disclosure herein is not for purposes of limiting the present invention. Any modification, equivalent replacement, improvement and so on made within the spirit and principle of the present invention should be encompassed within the protection scope of the present invention.

The invention claimed is:

1. A curved surface display device, comprising: a display panel, a casing, a bracket, a motor, a first arc lever and a second arc lever;
   wherein the display panel is mounted on the casing, the casing is supported by the bracket;
   wherein the first arc lever and the second arc lever are symmetrical with respect to a middle axis of the display panel in a vertical direction, and wherein pivots of the first arc lever and the second arc lever are both located on the bracket;
   wherein a first end of the first arc lever is connected with the motor through a connector, and a second end of the first arc lever is connected with the casing;
   wherein a first end of the second arc lever is connected with the motor through the connector, and a second end of the second arc lever is connected with the casing;
   wherein the connector is used for pulling the first end of the first arc lever and the first end of the second arc lever with rotation of the motor, such that the first arc lever and the second arc lever rotate around their pivots respectively;
   wherein the connector is a connecting line, the connecting line passes through a pulley;
   wherein the pulley is mounted on a back cover of the casing, and is located above the motor; and
   wherein a distance between the pulley and a base of the bracket, a distance between the first arc lever and the base and a distance between the second arc lever and the base are equal.

2. The curved surface display device according to claim 1, further comprising: a first push plate and a second push plate;
   wherein the second end of the first arc lever is connected with the first push plate;
   wherein the second end of the second arc lever is connected with the second push plate;
   wherein the first push plate and the second push plate are mounted on the casing, and located at a side of the display panel away from a viewer of the curved surface display device, and wherein the first push plate and the second push plate are symmetrical with respect to the middle axis of the display panel in the vertical direction.

3. The curved surface display device according to claim 1, wherein the display panel is a flexible display panel, wherein the casing is a flexible casing, and wherein the flexible display panel is capable of bending with bending of the flexible casing.

4. The curved surface display device according to claim 1, wherein the connecting line is a carbon fiber line.

5. The curved surface display device according to claim 1, wherein the motor is fixed on the base of the bracket.

6. The curved surface display device according to claim 1, wherein the bracket is symmetrical with respect to the middle axis of the display panel in the vertical direction, and wherein the pivot of the first arc lever and the pivot of the second arc lever are symmetrical with respect to the middle axis of the display panel in the vertical direction.

7. The curved surface display device according to claim 1, further comprising a camera electrically connected with the motor.

8. The curved surface display device according to claim 1, further comprising an infrared receiver electrically connected with the motor.

9. The curved surface display device according to claim 1, further comprising a voice receiver electrically connected with the motor.

10. A curved surface display method, the curved surface display method being applied in the curved surface display device as claimed in claim 1, and the curved surface display method comprising:

motor rotating, to pull a first end of a first arc lever and a first end of a second arc lever through a connector, such that the first arc lever and the second arc lever rotate around their pivots respectively;

during rotation of the first arc lever and the second arc lever around their pivots respectively, a second end of the first arc lever and a second end of the second arc lever applying forces to a casing, so as to enable the casing to bend, wherein the connector is a connecting line, the connecting line passes through a pulley; and wherein the motor rotating so as to pull the first end of the first arc lever and the first end of the second arc lever through the connector comprises: the motor drives the pulley to rotate through the connecting line, and pulls the first end of the first arc lever and the first end of the second arc lever with rotation of the pulley.

11. The curved surface display method according to claim 10, wherein the curved surface display device further comprises a first push plate and a second push plate; and wherein during rotation of the first arc lever and the second arc lever around their pivots respectively, the second end of the first arc lever and the second end of the second arc lever applying forces to the casing so as to enable the casing to bend comprises: during rotation of the first arc lever and the second arc lever around their pivots respectively, the second end of the first arc lever applying a force to the first push plate, the second end of the second arc lever applying a force to the second push plate, such that the first push plate and the second push plate push the casing, so as to enable the casing to bend.

12. The curved surface display method according to claim 10, wherein the curved surface display device further comprises a camera, the curved surface display method further comprises:

the camera measuring a distance between a viewer of the curved surface display device and the camera, determining a rotation direction and rotation distance of the motor based on the measured distance;

the motor rotating according to the determined rotation direction and rotation distance.

13. The curved surface display method according to claim 10, wherein the curved surface display device further comprises an infrared receiver, and wherein the curved surface display method further comprises:

the infrared receiver receiving an infrared signal transmitted by a remote controller, determining a rotation direction and a rotation distance of the motor based on the infrared signal; and the motor rotating according to the determined rotation direction and rotation distance.

14. The curved surface display method according to claim 10, wherein the curved surface display device further comprises a voice receiver, and wherein the curved surface display method further comprises:

the voice receiver receiving voice information, determining a rotation direction and a rotation distance of the motor based on adjustment voice information contained in the voice information;

the motor rotating according to the determined rotation direction and rotation distance.

* * * * *